United States Patent [19]
Val

[11] Patent Number: 5,400,218
[45] Date of Patent: Mar. 21, 1995

[54] DEVICE FOR THE 3D ENCAPSULATION OF SEMICONDUCTOR CHIPS

[75] Inventor: Christian Val, St. Remy les Chevreuse, France

[73] Assignee: Thomson-CSF, Puteaux, France

[21] Appl. No.: 27,355

[22] Filed: Mar. 8, 1993

[30] Foreign Application Priority Data

Mar. 10, 1992 [FR] France .................. 92 02846

[51] Int. Cl.⁶ .............................................. H05K 7/20
[52] U.S. Cl. ................... 361/709; 257/713; 361/777
[58] Field of Search ............... 174/252, 52.2; 165/80.3, 185; 257/706, 712, 713, 724; 361/689, 690, 704, 707, 709, 716, 718, 719, 720, 721, 761, 764, 767, 768, 772, 774, 776, 777, 778, 784

[56] References Cited

U.S. PATENT DOCUMENTS

| | | | |
|---|---|---|---|
| 3,671,812 | 6/1972 | Peluso | 174/DIG. 3 |
| 4,017,963 | 4/1977 | Beyerlein | 29/577 |
| 4,408,256 | 10/1983 | Val | 361/403 |
| 4,413,170 | 11/1983 | Val | 219/216 |
| 4,518,818 | 5/1985 | Le Ny | 174/52.4 |
| 4,546,028 | 10/1985 | Val | 428/116 |
| 4,553,020 | 11/1985 | Val | 219/209 |
| 4,559,579 | 12/1985 | Val | 361/220 |
| 4,639,826 | 1/1987 | Val | 361/272 |
| 4,654,694 | 3/1987 | Val | 357/74 |
| 4,706,166 | 11/1987 | Go | 361/403 |
| 4,755,910 | 7/1988 | Val | 361/401 |
| 4,953,005 | 8/1990 | Carlson | 357/80 |
| 4,953,060 | 8/1990 | Lauffer | 361/388 |
| 5,002,895 | 3/1991 | LeParquier | 437/8 |
| 5,199,164 | 4/1993 | Kim | 29/840 |
| 5,239,448 | 8/1993 | Perkins | 361/764 |
| 5,247,423 | 9/1993 | Lin | 361/719 |

FOREIGN PATENT DOCUMENTS

| | | |
|---|---|---|
| 0490739 | 12/1991 | European Pat. Off. |
| 01123427 | 5/1989 | Japan |
| 03064934 | 3/1991 | Japan |
| 03116860 | 5/1991 | Japan |

OTHER PUBLICATIONS

IEEE Transactions on Components, Hybrids, and Manufacturing Technology, Christian Val, 1990, pp. 814–821.

Christian Val, Proceedings of the 40th Electronic Components & Technology Conference, 1990, pp. 540–547.

Electronic Engineering, 'Semicon Europa—The Shape of Things to Come,' 1990, pp. 49, 50, 52, 54, 57.

Primary Examiner—Gerald P. Tolin
Attorney, Agent, or Firm—Roland Plottel

[57] ABSTRACT

Disclosed is a 3D encapsulation of semiconductor chips, each chip containing for example an integrated circuit, this encapsulation being aimed at optimising heat dissipation by conduction. Connection means are associated with each chip, making it possible to extend the pads of chips towards three sides of the chip, thus leaving the fourth side free. The chips are stacked on one another and then can be connected to heat dissipation means by their fourth side.

18 Claims, 7 Drawing Sheets

DEVICE FOR THE 3D ENCAPSULATION OF SEMICONDUCTOR CHIPS

BACKGROUND OF THE INVENTION

1. Field of the Invention

An object of the present invention is a method for the 3D encapsulation of semiconductor chips, each of the chips containing, for example, an electronic component, an integrated circuit or a sensor, this encapsulation being designed to display efficient heat dissipation or removal by conduction.

2. Description of the Prior Art

The making of current electronic systems, for both civilian and military use, should take account of increasingly greater requirements of compactness owing to the constantly rising number of circuits that are being implemented.

In this search for greater compactness, it has already been proposed to make 3D stacks of integrated circuits as is described, for example, in the U.S. Pat. No. 4,706,166. According to this embodiment, the chips are positioned on a printed circuit, against one another perpendicularly to the printed circuit. The connection pads or contacts of each of the chips are brought to one and the same border region of the chip. This side is positioned on the printed circuit, and the connections with the printed circuit are made thereon. However, this arrangement has limitations, related notably to the number of pads that it is physically possible to place on only one side of a semiconductor chip. In addition, this arrangement is costly because the chips are not standard ones (the arrangement of the pads has to be modified). Furthermore, there is little access possible to the connections thus made and, in addition, these connections cannot be seen: this limits their use. Finally, in certain applications, a problem of heat dissipation may arise. Conventionally, this heat dissipation may be achieved by conduction or by convection. In the embodiment described here above, heat dissipation by conduction is limited owing to the fact that it can be done only by the pads providing the electrical connection to the printed circuit, these pads having a small section and being limited in number. To work satisfactorily, therefore, a device such as this has to be cooled by convection. However, in certain applications, cooling of this type is difficult and even impossible to implement, notably in avionic or space applications.

SUMMARY OF THE INVENTION

An object of the invention is a 3D encapsulation of integrated circuits that enables efficient heat dissipation by conduction while at the same time remaining inexpensive.

To this end, the pads of each of the chips are extended by connection means towards, at most, three sides of the chip, thus leaving the fourth side free. The chips are stacked on one another, and then connected to heat dissipation means by their fourth side, thus enabling a process of cooling by conduction.

BRIEF DESCRIPTION OF THE DRAWINGS

Other objects, special features and results of the invention shall emerge from the following description, given by way of an example and illustrated by the appended drawings, of which.

In these different figures, the same references refer to the same elements. Furthermore, for clarity's sake, the figures have not be drawn to true scale.

MORE DETAILED DESCRIPTION

Figure 1:
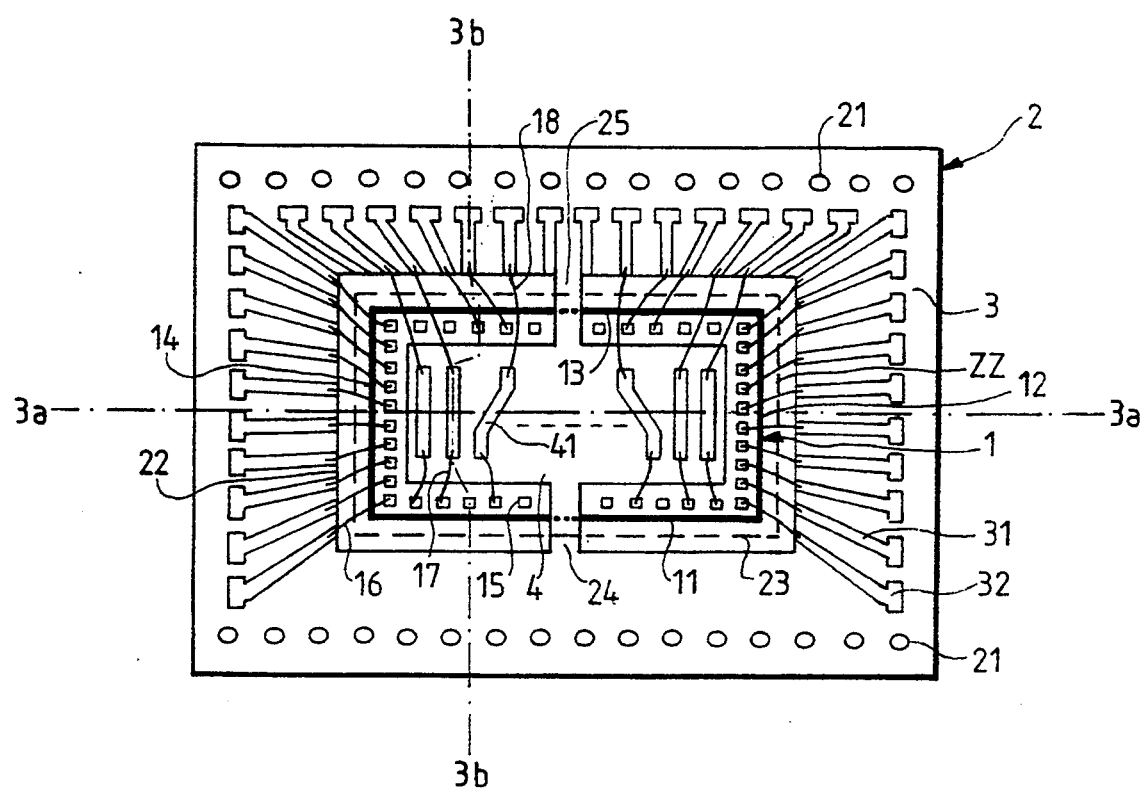
FIG. 1 shows a top view of the chip and of its connection means that go into the formation of the device according to the invention.

FIG. 1 therefore shows a top view of a chip and of its connection means.

This figure shows a semiconductor chip 1 in which any electronic component, integrated circuit or sensor can be made. The chip is rectangular for example, and its four sides are respectively referenced 11, 12, 13 and 14. The upper face of this chip, which can be seen in the figure, bears electrical input/output pads 15 for the element contained in the chip. These pads are placed, for example, on all four sides of the chip.

According to the invention, each of the pads 15 is connected to connection means by which these connections can be directed towards, at most, three sides of the chip, thus leaving free the fourth side which is the side 11 in the example of FIG. 1. The connection means comprise an insulating film 2, preferably a thin film, made for example of polyimide or polyester. In this insulating film 2, a cut 23 is made, leaving a frame 3 and a central part 4 connected to the frame by two tabs 24 and 25. The borders of the frame 3, for example two of its borders, include holes 21, for example rectangular or oblong holes, that enable the guiding and the precise positioning of the film 2 on an automatic wiring machine for example. The frame 3 further comprises a set of pads 32, positioned in the vicinity of the periphery of the frame 3, these pads 32 being positioned, according to the invention, on three sides at most, leaving free that side of the frame 3 which is located on the same side as the side 11 of the chip 1. These pads 32 are connected to the inner border 22 of the frame 3 by conductive deposits or tracks 31 made on the film 2. The pads 32 are used for example for testing and burning in of the semiconductor chips, before their stacking. The central part 4 also has tracks referenced 41, which may or may not be rectilinear.

The pads 15 located on the sides 12, 13 and 14 of the chip 1 are connected directly to the tracks 31 of the frame 3, in the vicinity of the inner border 22, by means of a conductor 16, which may be a wire as shown in the figure or a strip. Those of the pads 15 that are located on the side 11 are connected by conductors 17 (wires or strips) to one end of the tracks 41 borne by the central part 4, the other end of these tracks being connected by conductors 18 (wires or strips) to the tracks 31 located, for example, on the side of the frame 3 that is opposite the side 11. These operations may typically be performed by means of automatic wiring machines, used for example to wire the semiconductor chips into their pack.

It can thus be seen that one of the sides of the chip 1 (the side 11) has been left free of any connection. These side left free can be used for heat dissipation by conduction, as explained further below. With this end in view, it is preferable to leave free a large side of the rectangle. But, naturally, one or more other sides may be left free, depending on the use.

Figure 2:
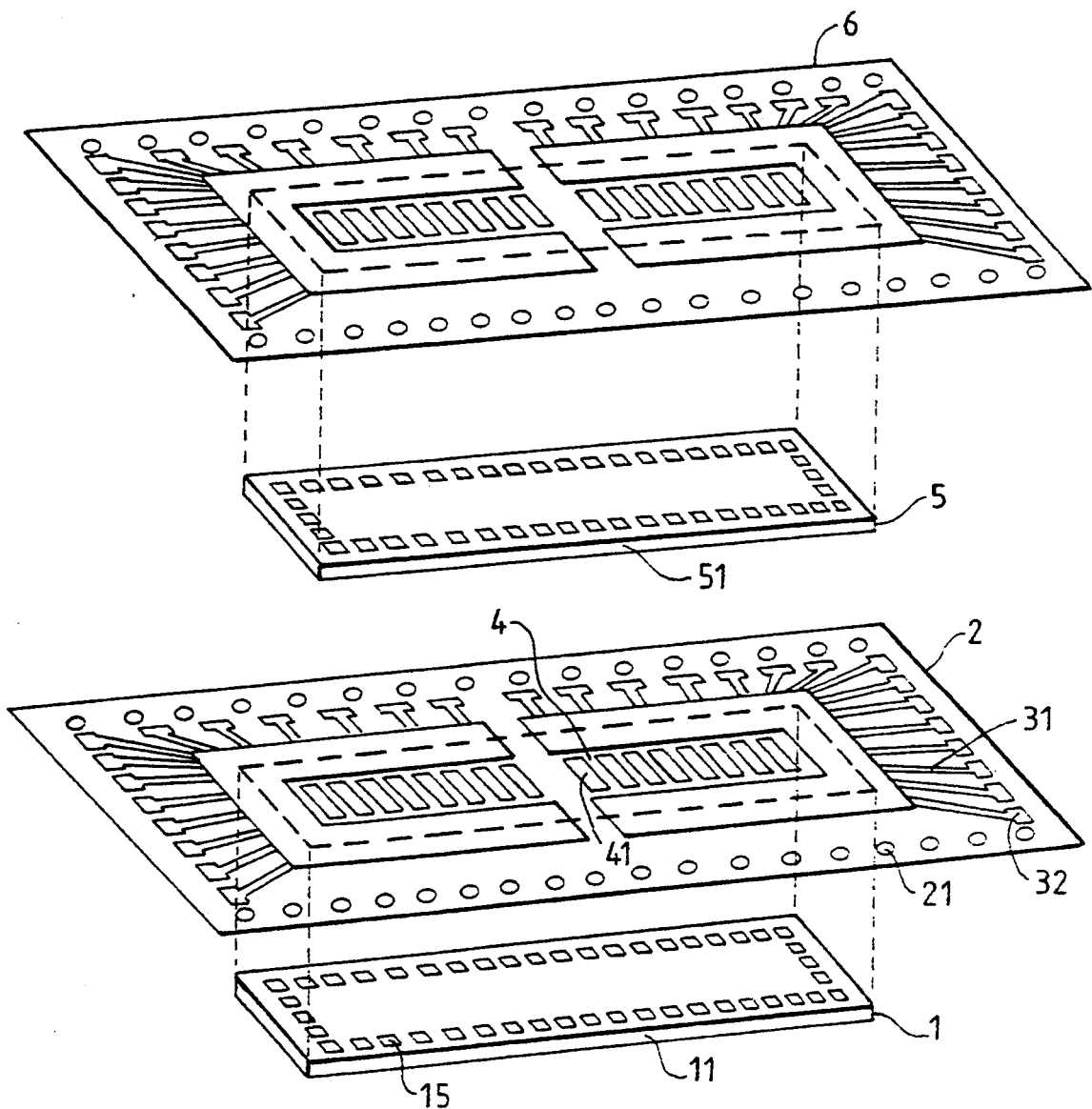
FIG. 2 shows an exploded and partial view of the device according to the invention.

According to the invention, a plurality of chips such as these and their connection means are stacked one on top of the other, as illustrated in the exploded view of FIG. 2 for two chips.

FIG. 2 again shows the semiconductor chip 1 and its connection means, formed by the insulating film 2 and its conductive tracks and pads 31, 41 and 32. In this FIG. 2, the conductors 16, 17 and 18 have not been shown. The figure also shows a second semiconductor chip, referenced 5, with which there are associated connection means, constituted similarly to the connection means of the chip 1 by a dielectric film 6 comprising a frame and a central part, on which tracks and pads are positioned. The elements 1, 2, 5 and 6 are stacked on one another and the chips 1 and 5 are positioned so that their free sides (11 for the chip 1, 51 for the chip 5) are located on the same side of the stack thus made.

Figure 3A:
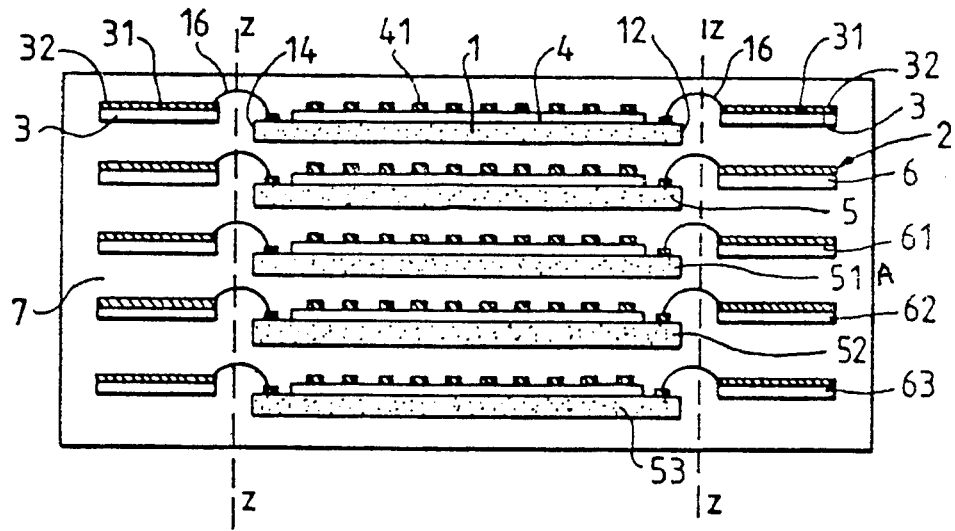
FIGS. 3a and 3b show two sectional views of the device according to the invention.

FIG. 3a shows a sectional view of the stack according to the invention, made along the axis XX illustrated in FIG. 1, perpendicular to the sides 12 and 14 of the chips.

This FIG. 3a again shows the semiconductor chip 1 provided with its connection means, namely tracks (31 and 41), pads (32) and conductors (16). This assembly constitutes, for example, the upper layer of a stack of five chips, the other chips being referenced 5, 51A, 52 and 53, each provided with its connection means borne by an insulating film (6, 61, 62 and 63). The assembly is fixedly joined together by means of an insulating material 7, for example an epoxy resin. For the clarity of the figure, the insulating materials (7, 3, 6, 61-63), although seen in a sectional view, have not been hatched.

The stack is then cut or sliced along a line ZZ of FIG. 1 going through the cut 23, between the central part 4 and the frame 3. The cutting or slicing lines are shown by zz in FIG. 3a. As a result, the frames 3 are removed and the conductors 16 are flush with the faces of the stack.

Figure 3B:
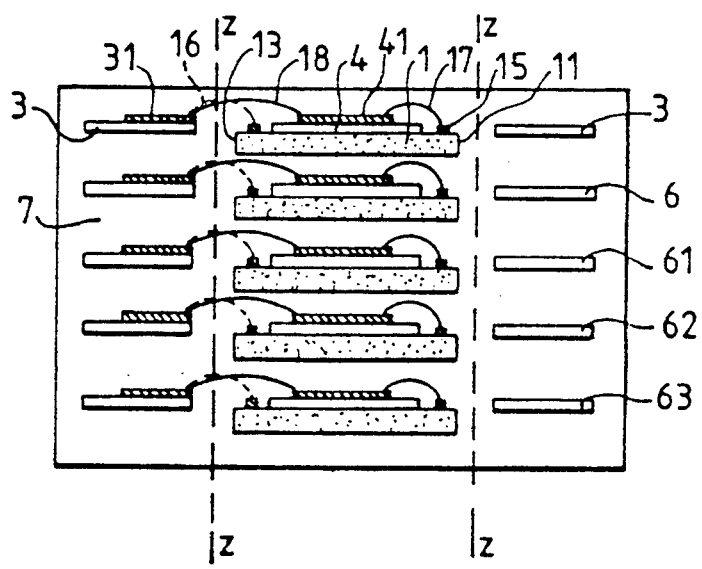

FIG. 3b is a sectional view similar to that of FIG. 3a but drawn perpendicularly to the preceding one, along an axis YY of FIG. 1. This view makes it possible to illustrate the freeing of the side 11 of the semiconductor chips.

In this figure, the sides 11 and 13 of the semiconductor chip 1 are seen, covered with the central part 4 of the insulating film and surrounded by the frame 3 of this same film. It can be seen that pads 15 of the chip which are located on the side 11 are connected by the conductors 17 to the tracks 41 borne by the central part 4. These tracks 41 are connected, at their other ends, by the conductors 18 to the tracks 31 of the frame 3. Dashes have been used to show the pads 15 located on the side 13 of the chip, which are connected directly by the conductors 16 to other tracks 31 of the frame 3.

As earlier, the figure shows the fixing material 7 and the slicing lines zz corresponding to the line ZZ of FIG. 1. The slicing zz done on the side 11 may be done either level with the chip 1 or substantially in the middle of the cut 23, as illustrated in the figures. In the latter case, the stack should be subsequently polished so as to make the edge of the chips flush with this face of the stack to enable efficient heat dissipation by conduction.

In one alternative embodiment, the edges of the chips are not made flush with the stack but a certain thickness of the insulating material 7 is allowed to remain: this thickness is small enough not to hamper the heat dissipation but remains sufficient to give the stack the mechanical protection and imperviousness that may be necessary in certain applications.

Figure 4:
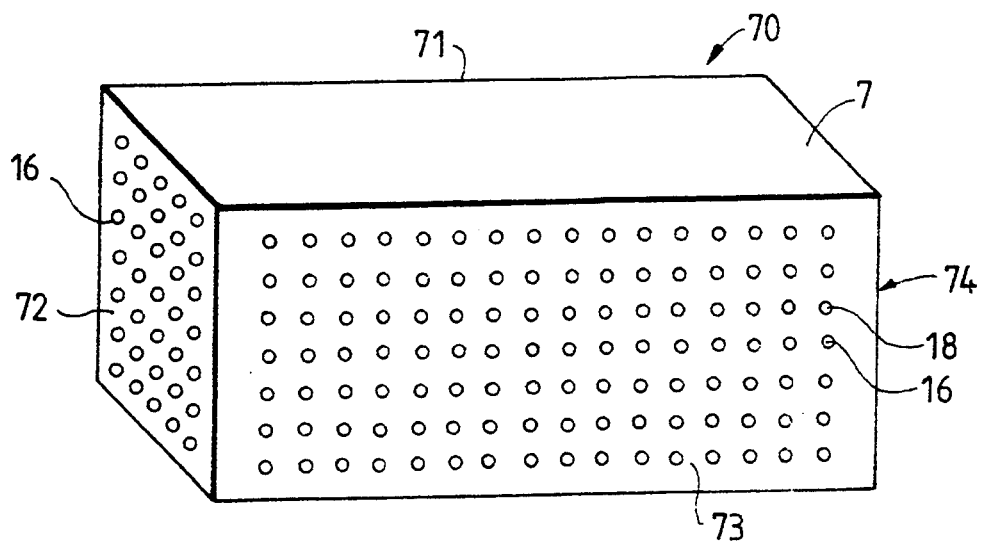
FIG. 4 shows a projection of the stack made according to the invention.

FIG. 4 shows a projection of the stack, after an operation of slicing along the line ZZ of FIG. 1.

The stack therefore appears as a block 70 formed by the dielectric material 7, the conductors 16 and 18 being flush with certain of its faces.

More specifically, the reference 71 has been used to designate that face of the stack which corresponds to the side 11 of the chips 1 (in the drawing, the rear rectangular face), the reference 72 has been used to designate the face that corresponds to their side 12 and the reference 74 has been used to designate the face that corresponds to their side 14. Hence, the conductors 16, directly connecting the pads 15 of the chips to the tracks 31 of the frame before it is sliced, are flush with the face 73. Conductors such as 16, directly connected to pads of the chips, as well as conductors such as 18, which are connected to the pads 15, located on the side 11 by means of the tracks 41 of the central part 4, are flush with the face 73.

This figure shows the conductors 16 and 18 aligned according to evenly spaced out lines and columns: this arrangement is shown, of course, by way of an example and the distribution of the conductors can be adapted to the applications.

Figure 5:
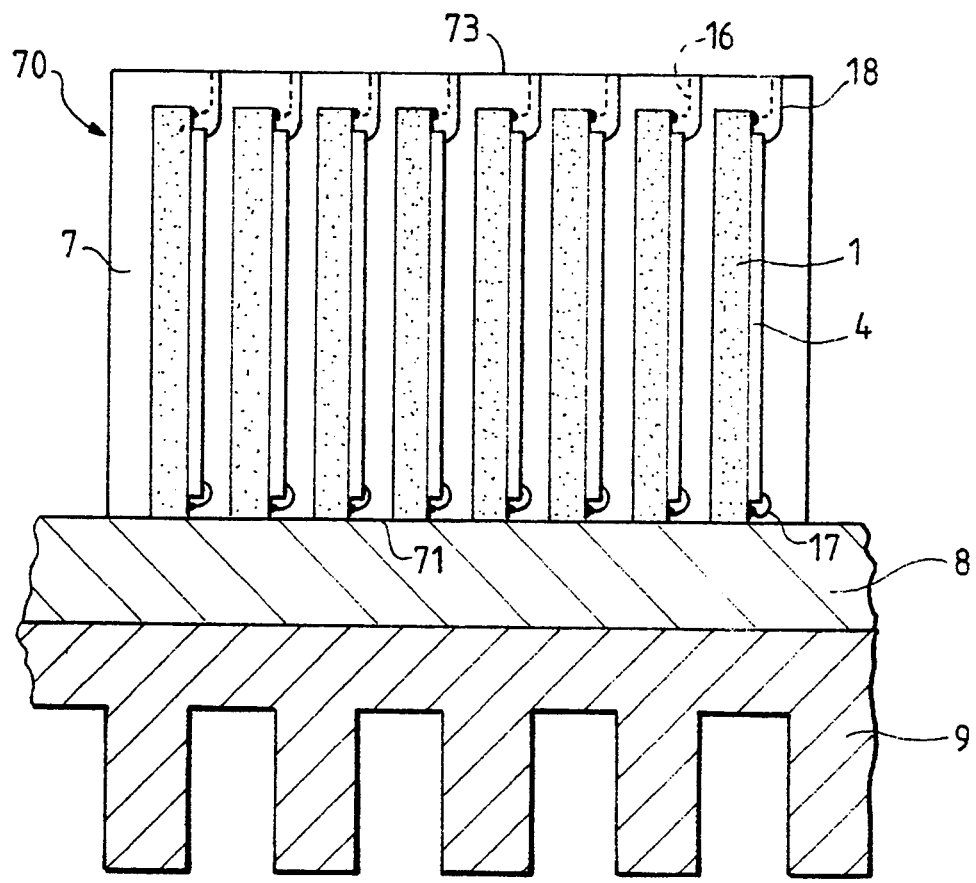
FIG. 5 shows a sectional view of the device according to the invention, connected to heat dissipation means.

FIG. 5 shows a sectional view of the stack according to the invention, connected to heat dissipation means.

In this figure, the stack 70 according to the invention is formed, for example, by eight chips such as 1, each provided with the central part 4 of the film 2. The pads of the chips 1 are connected either directly by the conductors 16 (shown in dashes) to the face 73 of the stack or indirectly by the conductors 17, 18 and the central part 4 to this same face 73. As explained here above, the pads of the chips can also be connected to the faces 72 and 74 of the stack, which cannot be seen in the sectional view of FIG. 5.

According to the invention, the face 71 which does not include electrical connections and with which the chips are flush is connected to heat dissipation means. In the embodiment shown in the figure, these means are constituted for example by a finned or ribbed radiator type of heat sink 9 made of a material that is a good conductor of heat and preferably electrically insulating.

The stack 70 may be connected directly to the heat sink 9 if the thermal expansion coefficients of the elements 70 and 9 are sufficiently close to each other. If the chips 1 are made of silicon, for example, the heat sink 9 may be made of aluminium nitride, silicon carbide or diamond. If not, the stack 70 may be connected to the heat sink 9 by means of a layer 8, as shown in FIG. 5, the layer 8 providing for the necessary thermo-mechanical adaptation and being made of one of the preceding materials for example. The elements 70, 9 and possibly 8 are, as needed, fixed to one another by a very thin layer of bonder.

Figure 6:
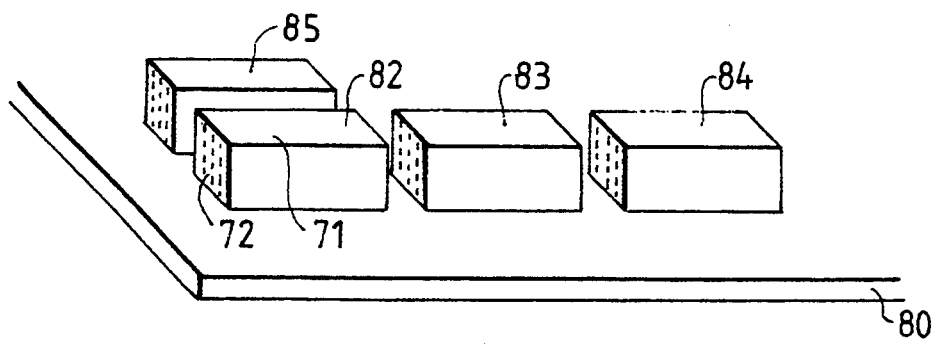
FIG. 6 shows a partial projection of a printed circuit bearing several devices according to the invention.

FIG. 6 shows a partial projection of a printed circuit bearing several stacks according to the invention.

A printed circuit 80 has been shown, bearing for example four stacks referenced 82, 83, 84 and 85. Each of the stacks is positioned on the printed circuit by its face 73 so as to be capable of connecting the face 71 to heat dissipation means (not shown) as illustrated in FIG. 5. The ends of the conductors connecting the pads of the chips are flush with the faces 72, 73 and 74 of each of the blocks.

Figure 7:
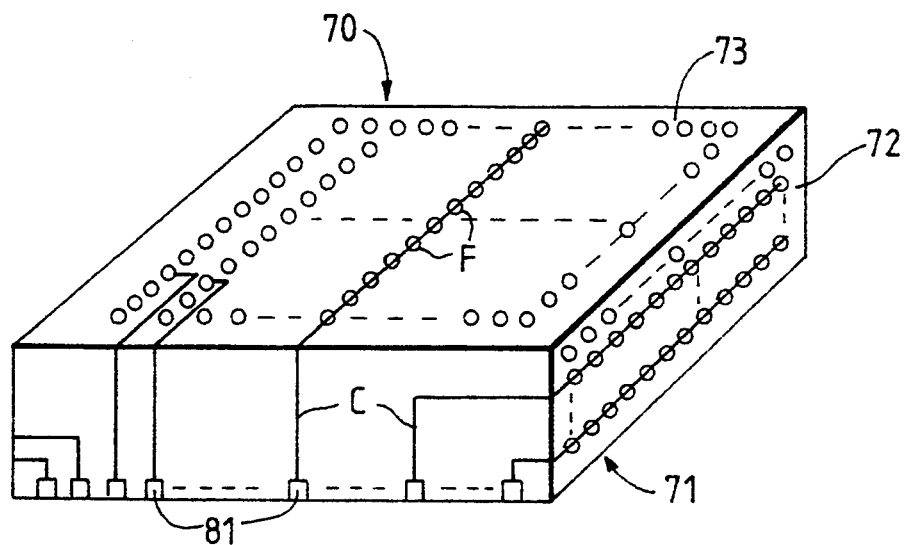
FIG. 7 shows an exemplary embodiment of the interconnection of the chips.

FIG. 7 shows an exemplary embodiment of the interconnection of the chips forming a stack 70, this interconnection being formed on the lateral surfaces of the stack.

This figure again shows the stack 70, comprising the faces 72 and 73 with which the conductors, connected directly or otherwise to the pads of the chips, are flush. In this figure, the face 71 with which the chips themselves are flush is placed below. The conductors flush with the faces 72 or 73 are referenced F without distinction, irrespectively of whether they correspond to the conductors 16 or to the conductors 18 of the preceding figures. The stack 70 further comprises pads 81, called stack pads, enabling it to be connected to external circuits. The conductors F are connected to each other, when necessary, and at the same time connected to the stack pads 81, also when necessary, by means of the connections C. By way of an example, the stack pads 81 have been shown on a face parallel to the chips 1, in the vicinity of the face 71, but it is clearly possible for them to occupy any position on the faces of the stack except on the face 71.

Each of the connections C can be made as follows: all the faces of the stack 70 are metallized and then each of the connections C is formed by two laser etching operations that destroy the metal layer locally up to the insulating layer, thus achieving the electrical insulation of the connection C from the rest of the metal layer. The stack pads 81 may be advantageously made by the same laser etching technique.

Another method for the making of the connections C is first of all in making grooves in the stack according to the design chosen for the connections C, at the level where the conductors F are flush, so as to reveal the ends of these conductors. Then an electrically conductive layer (of metal for example) is deposited on the entire stack, the faces and the grooves. Then, the conductive layer is removed from the plane surfaces of the stack (by polishing or by laser for example) so as to let it remain only on the grooves where it forms the desired connections.

Figure 8:
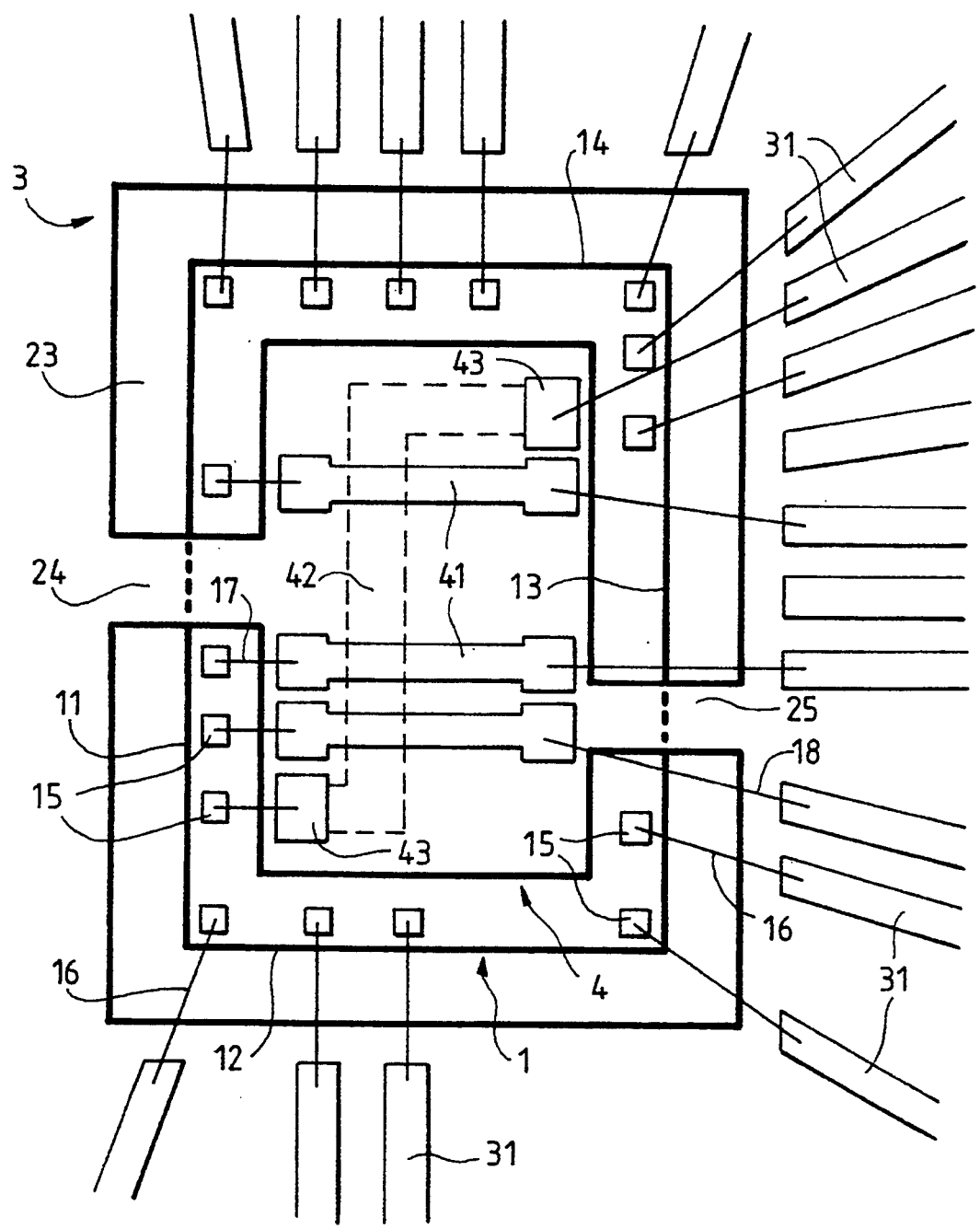
FIG. 8 shows an alternative embodiment of the connection means of a chip used in a device according to the invention.

FIG. 8 shows an alternative embodiment of the connection means of a chip, used in the device according to the invention.

This figure shows a partial top view of a chip 1 and of its connection means, borne by the insulating film comprising the central part 4 and the frame 3. In this embodiment, the connection means are borne no longer by a single insulating film but by a multilayered film, formed by a plurality of electrically conductive layers (two, for example) separated by insulating layers, so as to provide for greater freedom as regards the routing of the tracks of the central part.

More specifically, a partial view has been shown of the frame 3 provided with its tracks 31, as well as the chip 1 provided with its pads 15, covered by the central part 4 which is connected to the frame 3 by tabs 24 and 25. It will be noted that these tabs are not necessarily two in number, nor do they necessarily have the same width, and that it is not indispensable for them to be positioned so that they face each other.

The multilayered constitution of the central part 4 enables the making of the intersections of the tracks borne by this central part, so as so as to connect the pads 15 of the side 11 of the chip to any one of the other sides of the frame 3. For example, the figure shows three substantially rectilinear tracks 41 on the central part 4, enabling the pads 15 to be made to emerge via the conductors 17 and 18 on the face 73 of the stack once it is completed. A track 42 has also been shown, in dashes because it is formed in the lower conductive layer which enables the connection, to each other, of two pads 43 of the part 4 which, for their part, are formed on the upper layer and are connected to the track 42 by any known means (via holes through the insulating central layer for example). One of the pads 43 is located, for example, at the bottom left of the part 4 and is connected to the pad 15 that faces it. The other pad 43 is located at the top right of this same part 4 and is connected to a track 31 that substantially faces it. Naturally, the pads and tracks of the central part 4 are formed in one of the conductive layers and are insulated from the rest of the layers.

Figure 9A:
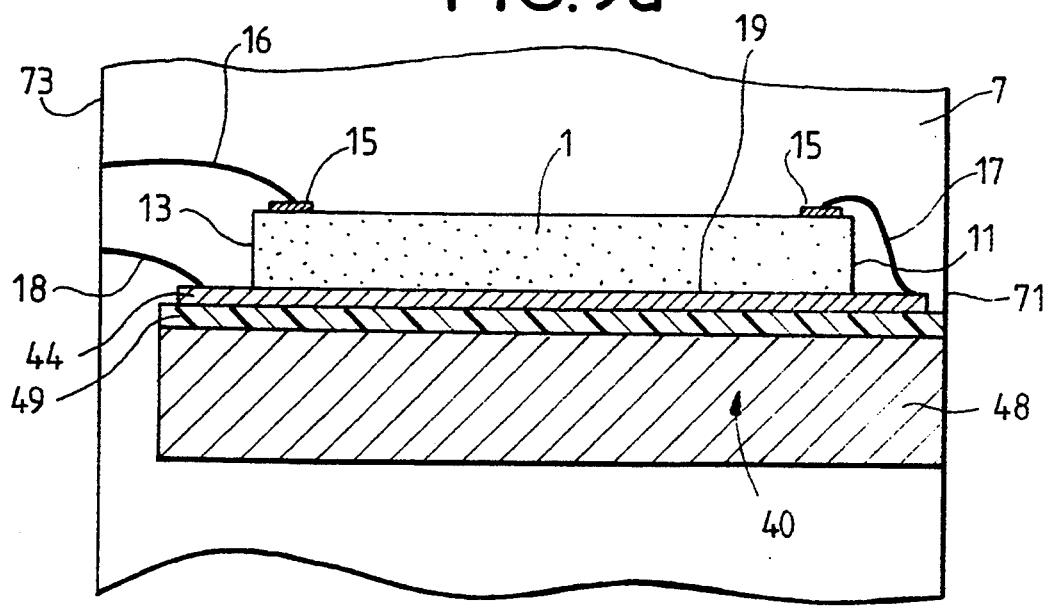
FIGS. 9a and 9b show other alternative embodiments of the connection means of a chip.
Figure 9B:
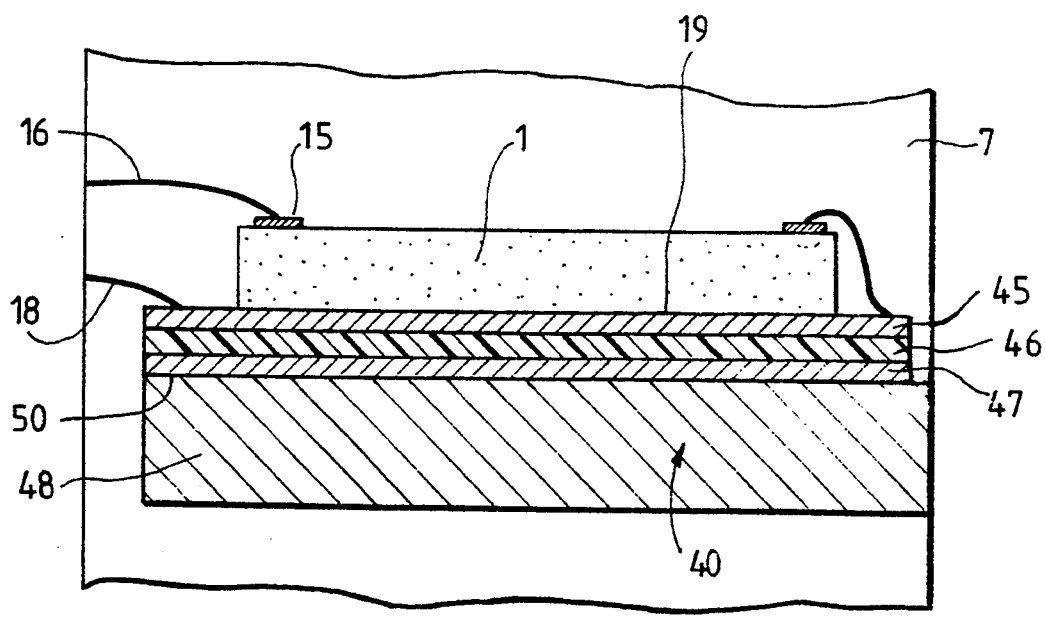

FIGS. 9a and 9b show other alternative embodiments of the connection means of the chips.

FIG. 9a shows a partial sectional view of a stack according to the invention, wherein only one chip 1 and its connection means are shown, coated in the insulating material 7. For the clarity of the drawing, it has not been hatched, although it is seen in a sectional view.

According to this embodiment, the stack is made as described here above, except as regards the relative position of the connection means and of the corresponding chip: indeed the film, and especially the central part, now referenced 40, is positioned beneath the chip 1, namely against its rear face 19 which does not bear the connection pads 15. The chip 1 is therefore fixed to the central part 40, if necessary by means of an insulating bonder. As above, certain of the pads 15 are connected directly to the faces of the stack (by conductors 16), for example to the face 73 in the figure. By contrast, the pads 15 located on the side 11 of the chip are indirectly connected to these same faces, by means of tracks borne by the central part which are herein referenced 44 and positioned on an insulating layer 49 and by means of conductors 17 and 18. The face 71, as above, therefore has no connections. Finally, the central part 40 further comprises a layer 48 of a material that is a good conductor of heat, for example copper, positioned on the insulating layer 49, opposite the tracks 44.

In this embodiment, it is the central part 40 and especially the conductive layer 48 that is flush with the face 71, and not directly the side 11, because of the conductors 17. However, efficient heat dissipation may be ensured here, provided that an appropriate choice is made of the materials constituting the part 40 as well as of its dimensions, which then depend solely on the thermal parameters.

FIG. 9b is a view similar to that of FIG. 9a, illustrating an alternative embodiment of the preceding figure in which the central part is multilayered, in a manner similar to that described with reference to FIG. 8.

More specifically, the part 40 herein comprises four layers: two conductive layers 45 and 47 separated by an insulating layer 46 and the conductive layer 48. One of the conductive layers, for example the layer 45, is positioned on the face 19 of the chip and is, for example, fixed by an insulating bonder. The conductors 17 and 18 are connected to pads formed in the layer 45. In a manner similar to that described in FIG. 8, certain of these pads of the layer 45 are connected to one another by tracks also formed in the layer 45, while certain other pads are formed in the layer 47 and are connected to this layer 47 through the layer 46 by any known means, via holes for example. The thermally conductive layer 48 is fixed to the layer 47, if necessary by means of an insulating bonder 50.

In either one of the variants shown in FIGS. 9a and 9b, it is possible to add conductive heat drains (not shown) that are made of a material which is a good conductor of heat, going through the layers between the layer 48 and the rear face 19 and that are, as the case may be, electrically insulated from these layers, improving the thermal conduction through the part 40 and hence the removal of the heat.

A description has been given of a device for the 3D encapsulation and interconnection of semiconductor chips that is both adapted to cooling by conduction and inexpensive.

Indeed, as regards the heat dissipation, it is done either directly by the edge of the chips (preferably, the large side of the rectangle) or by the connection means of the chips, the sizing and the constituent materials of which may be adapted to the thermal function that is assigned to them, these constituent materials having no local constraints related to the electrical connection systems to be made.

As for the manufacturing costs, they are low because the invention uses standard chips, films commonly used in chip encapsulation technology and automatic wiring machines, which themselves are also commonly used in this technology, the total number of the operations needed to constitute a block being furthermore very limited.

What is claimed is:

1. A device for the encapsulation of semiconductor chips comprising a plurality of chips, each of said chips comprising connection pads; connection means for each of the chips, said connection means comprising an insulating film and conductive tracks positioned on said film, said tracks being connected to the pads by means of conductors, said tracks and conductors making electrical connections extending from the pads of the chips towards at most three of four sides of the chips, the chips with the connection means being fixedly joined to each other by means of an electrically insulating material to form a stack, so that the conductors are flush with the faces of the stack except on at least the face which is located on the fourth side of the chips, electrical connection of the conductors to one another being achieved by connections on the faces of the stack.

2. A device according to claim 1, wherein said face of the stack located on the fourth side of the chips does not have conductors, said stack further comprising stack pads formed on one or more of its faces with the exception of said face, said stack pads being designed for the connection of the stack with external circuits, said connections further linking at least certain of the conductors with the stack pads.

3. A device according to claim 1, wherein said face of the stack which is located on the fourth face of the chips is connected to heat dissipation means.

4. A device according to claim 1 wherein the conductors are wires or strips.

5. A device according to claim 1, wherein said insulating film of said connection means has a surface area smaller than the surface area of said chip, and is positioned on the face of the chip that bears the pads.

6. A device to claim 1, wherein said insulating film of said connection means has dimensions greater than the dimensions of the chip and wherein it is positioned on the rear face of the chip, which does not bear pads.

7. A device according to claim 1, wherein a fourth side of the chip is flush with the face of the stack.

8. A device according to claim 1, wherein said connections comprise a conductive layer covering substantially all the faces of the stack, said conductive layer being etched so as to form said connections.

9. A device according to claim 1, wherein said connections comprise grooves made in the stack and a conductive layer positioned in the grooves.

10. A device according to claim 1, wherein said chips and connection means are embedded in said insulating material.

11. A device according to claim 2, wherein said insulating material is a resin.

12. A semiconductor stack comprising:
(a) a plurality of semiconductor chips each having two major faces and four side faces, a plurality of connection pads distributed on one major face near a periphery of said face close to four sides of said chip, said chip being positioned with the major faces parallel to each other;
(b) a plurality of first conductors extending from the pads on three of said peripherals outward from said chips and substantially parallel to said major faces;
(c) a plurality of central frames of dielectric material, one for each of said chips, and having a plurality of electrically conductive tracks thereon, each of said frames being positioned adjacent to one of said chips, each track having one end near said fourth side of said chip and the other end near one of the three other sides;
(d) a plurality of electrical connections extending between the pads on the fourth of said peripheries of said chips to said one end of said electrically conductive tracks;
(e) a plurality of second conductors extending from said other end of said tracks outward from said chips and frames and substantially parallel to said major surfaces;
(f) an insulating material between said chips and bonding said chips, frames, and conductors into a single stack with the conductors extending to three surfaces of said stack which correspond to said three sides of said chips.

13. A stack according to claim 12, further comprising a third plurality of conductors on said three sides of said stack connected to the first and second conductors at said surfaces.

14. A stack according to claim 12, further comprising a heat sink connected to a fourth surface of said stack which comprises said fourth side surface of said chips, and said heat sink being in good thermal contact with said fourth side of said chips.

15. A stack according to claim 12, wherein said fourth side surface of said chips is at a fourth surface of said stack.

16. A stack according to claim 15, further comprising means for conducting heat connected to said fourth side of said stack.

17. A stack according to claim 12, further comprising a plurality of thermally conductive layers, each of said layers being positioned adjacent said frames on a face of the frame opposite the chip to form a sandwich of chip-frame-layer, and with the sandwiches separated by said insulating material.

18. A stack according to claim 17, wherein said thermally conductive layers extend with edges to a fourth side of said stack, and said fourth side corresponds to a fourth side of said chips.

* * * * *